United States Patent [19]
Lee

[11] Patent Number: 5,967,570
[45] Date of Patent: Oct. 19, 1999

[54] PANEL DETACHING APPARATUS FOR CAR-MOUNTED AUDIO SYSTEM

[75] Inventor: Bu-Kil Lee, Incheon, Rep. of Korea

[73] Assignee: Daewoo Electronics Co., Ltd., Seoul, Rep. of Korea

[21] Appl. No.: 09/092,005

[22] Filed: Jun. 5, 1998

[30] Foreign Application Priority Data

Jul. 6, 1997 [KR] Rep. of Korea ............. 97-23496

[51] Int. Cl.[6] ........................................ E05C 7/00
[52] U.S. Cl. ........................ 292/31; 292/24; 292/54; 292/DIG. 37; 248/27.3; 403/325
[58] Field of Search .................. 292/31, 16, 24, 292/25, 42, 44, 45, 54, 56, 114, 241, DIG. 37, DIG. 72; 248/27.1, 27.3; 403/322.4, 325

[56] References Cited

U.S. PATENT DOCUMENTS

| | | | |
|---|---|---|---|
| 654,155 | 7/1900 | Hiser et al. | 292/24 |
| 789,775 | 5/1905 | Ward | 292/DIG. 37 |
| 1,297,284 | 3/1919 | Wisniewski | 292/DIG. 72 |
| 1,540,088 | 6/1925 | Rasmussen | 292/25 |
| 1,574,023 | 2/1926 | Crompton et al. | 292/24 |
| 1,665,303 | 4/1928 | Hunter | 292/31 |
| 1,686,417 | 10/1928 | Norman | 292/114 |
| 2,226,072 | 12/1940 | Polack | 292/54 |
| 2,446,113 | 7/1948 | Spiller | 292/DIG. 37 |
| 4,947,661 | 8/1990 | Yoshida | 292/126 |
| 5,127,683 | 7/1992 | Sato et al. | 292/113 |
| 5,245,511 | 9/1993 | Watanabe | 248/27.3 |
| 5,381,684 | 1/1995 | Kawamura | 248/27.3 |

*Primary Examiner*—Suzanne Dino Barrett
*Assistant Examiner*—Stephen Grady
*Attorney, Agent, or Firm*—Jacobson, Price, Holman & Stern, PLLC

[57] ABSTRACT

First and second fixing portions 150, 170 are installed at one side of a panel for a car-mounted audio system for attaching the panel 100 to an escutcheon 200. First and second piercing holes 180, 190 formed at the panel 100 receive the first and second fixing portions 150, 170. The first and second fixing portions 150, 170 are respectively rotatably engaged with first and second bosses 185, 195 respectively formed at the first and second piercing holes 180, 190. First and second grooves 275, 277 are formed at the front face of the escutcheon 200 for respectively engaging with thereto.

9 Claims, 5 Drawing Sheets

5,967,570

PANEL DETACHING APPARATUS FOR CAR-MOUNTED AUDIO SYSTEM

BACKGROUND OF THE INVENTION

1. Field of the Invention

The present invention relates to a panel detaching apparatus for a car-mounted audio system, and more particularly, to a panel detaching apparatus for a car-mounted audio system capable of detaching a panel installed in a front face of the car-mounted audio system from the car-mounted audio system body for preventing the car-mounted audio system from being stolen.

2. Description of the Prior Art

Recently developed audio devices are generally compact. Especially, audio devices installed in a car or the like must be compact and thin due to the space limitations. The panel installed in the front side of the audio device has a liquid crystal display (hereinafter, referred to as LCD) to display information about the operation of the audio device, function knobs to indicate the operation, a recording medium inserting slot, and the like. When a driver leaves his or her car installed with the car audio having the panel, and to insure that the audio equipment cannot be used without the panel if stolen to thereby discourage possible theft by detaching the panel from the escutcheon, several devices have been proposed.

One conventional panel detaching apparatus for the car-mounted audio system is disclosed in U.S. Pat. No. 5,127,683.

In the appended figures, FIG. 1 is an exploded perspective view of a conventional panel detaching apparatus for a car-mounted audio system.

An escutcheon 10 for receiving a panel 20 is formed at the front side of a car audio system body. An upper supporting piece 11 and a lower supporting piece 13 are mounted at the rear face of the escutcheon 10 by screws. The upper supporting piece 11 and the lower supporting piece 13 are made of metal. A fixing part 15 is installed at the rear face of the escutcheon 10 by the upper supporting piece 11 and the lower supporting piece 13. The fixing part 15 has an upper protrusion 15A for hooking the panel 20. A lower protrusion 15B is elastically supported by a coil spring 17. A rotating piece 19 is installed between the upper supporting piece 13 and the escutcheon 10 so that the fixing part 15 rotates when the rotating piece 19 is pressed back toward the escutcheon 10.

The panel 20 capable of detaching is installed at the front face of the escutcheon 10. A groove 21 is formed at an upper end of one side of the panel 20. The groove 21 has a connecting protrusion 23 capable of engaging with the upper protrusion 15A of the fixing part 15 when the panel 20 has been mounted at the escutcheon 10. When the panel 20 is detached from the escutcheon 10, the upper protrusion 15A of the fixing part 15 is disengaged from the connecting protrusion 23. An ejecting knob 25 is installed at the front face of the panel 20. The ejecting knob 25 has a pin 25A which passes through the panel 20 to push out the rear face of the panel 20. The pin 25A pushes the rotating piece 19 installed at the escutcheon 10.

Hereinafter, an operation of the conventional panel detaching apparatus for the car-mounted audio system will be described.

In order to mount the panel 20 onto the escutcheon 10, an operator presses the panel 20 to the escutcheon 10. Thereafter the upper protrusion 15A of the fixing part 15 is fastened to the connecting protrusion 23 in the groove 21. That is, the panel 20 is attached to the escutcheon 10 by the fixing part 15 mounted on the rear face of the escutcheon 10.

In this state, the front panel 20 has been mounted at the escutcheon 10, and it becomes possible to operate the car-mounted audio system by pressing plural operation knobs installed at the panel 20.

In order to detach the panel 20 from the escutcheon 10 of the car-mounted audio system, an operator presses the ejecting knob 25 installed in the front face of the panel 20, and then the pin 25A forces the rotating piece 19 to move toward the rear side of the escutcheon 10. The rotating piece 19 forces the fixing part 15, rotatably supported by the upper supporting piece 11 and the lower supporting piece 13, to rotate. The fixing part 15 forces the upper protrusion 15A in the fixing part 15 to depart from the connecting protrusion 23 in the groove 21. In this time, the panel 20 is pushed by the restoring force of an unshown elastic part installed in the front face of the escutcheon 10. Therefore, the panel 20 is detached from the escutcheon 10.

According to the conventional panel detaching apparatus for the car-mounted audio system, first, in order to mount the panel 20 onto the escutcheon 10, a number of components are required.

Second, because a number of components are installed at the rear face of the escutcheon 10 by the screw, high production cost, additional time to assemble a number of components, and a number of assemblers are required.

Third, according to the conventional panel detaching apparatus for the car-mounted audio system, in order to attach the panel 20 to the escutcheon 10, since the operator of the car-mounted audio system must go through the above mentioned order to mount the rotating piece 19, the coil spring 17, the fixing part 15, and the supporting pieces 11 and 13 onto the rear face of the escutcheon 10, the method for mounting the front panel onto the escutcheon is somewhat difficult.

Fourth, since the connecting protrusion 23 formed at the groove 21 and the upper protrusion 15A in the fixing part 15 frequently make contact with each other, the connecting protrusion 23 may be worn away and gets damaged by the external impact. Therefore, the connecting force between the connecting protrusion 23 formed at the groove 21 and the upper protrusion 15A in the fixing part 15 may be decreased, and thus the panel 20 is easily detached from the escutcheon 10 when the car body is joggled.

SUMMARY OF THE INVENTION

Accordingly it is a first object of the present invention to provide a panel detaching apparatus for a car-mounted audio system capable of attaching the panel to the escutcheon simply with a few construction members.

It is a second object of the present invention to provide a panel detaching apparatus for a car-mounted audio system having low production cost and a short time to assemble a number of components with each other.

It is a third object of the present invention to provide a panel detaching apparatus for a car-mounted audio system for preventing the panel from easily detaching from the escutcheon although the car body is joggled during the traveling time of the car.

To achieve the above objects, the present invention provides a panel detaching apparatus for a car-mounted audio system according to the present invention having a rotating shaft 110 formed at one side of a panel 100, a receiving part 230 formed at an escutcheon 200 for receiving the rotating shaft 110, and an elastic part 250 installed at the front face of the escutcheon 200 and elastically supported, the panel detaching apparatus for the car-mounted audio system comprising:

first and second fixing portions 150, 170 respectively installed at the other side of the panel 100 and for attaching the panel 100 to the escutcheon 200 by the restoration force of a spring 130;

first and second piercing holes 180, 190 formed at the panel 100 and for respectively installing the first and second fixing portions 150, 170 to the panel 100;

first and second bosses 185, 195 respectively formed at the inner face of the first and second piercing holes 180, 190 and for respectively rotatably being installed with the first and second fixing portions 150, 170; and a connecting part 270 formed at a corresponding position of the front face of the escutcheon 200 to the first and second fixing parts 150, 170 and for engaging with the first and second fixing parts 150, 170.

The connecting part 270 has a depression part 271 sunk within the front face of the escutcheon 200. The depression part 271 receives the first and second fixing portions 150, 170 and then the panel 100 is closely attached to the escutcheon 200. The depression part 271 has a fastener part 273 protruding from the depression part 271 and for fastening the first and second fixing portions 150, 170. The first and second fixing parts 150, 170 are engaged with first and second grooves 275, 277.

In the panel detaching apparatus for the car-mounted audio system according to the present invention, it is a first advantage that the panel can be easily attached to the escutcheon simply with a few construction members.

Second advantage is low production cost and a short time to assemble a number of components with each other.

It is a third advantage that an operator just pushes the panel toward the escutcheon for mounting the front panel onto the escutcheon. That is, when the rotating shaft has been received in the receiving part, if the operator pushes the panel toward the escutcheon centering around the rotating shaft, the first and second fixing portions respectively engage with the first and second grooves. The spring provides the restoration force to the second fixing portion and then the panel is firmly attached to the escutcheon. Therefore, the panel detaching apparatus for the car-mounted audio system prevents the panel from easily detaching from the esutcheon although the car body is joggled during the traveling time of the car.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

The panel detaching apparatus for the car-mounted audio system will be described in detail with reference to FIG. 2 through FIG. 5.

Figure 1:
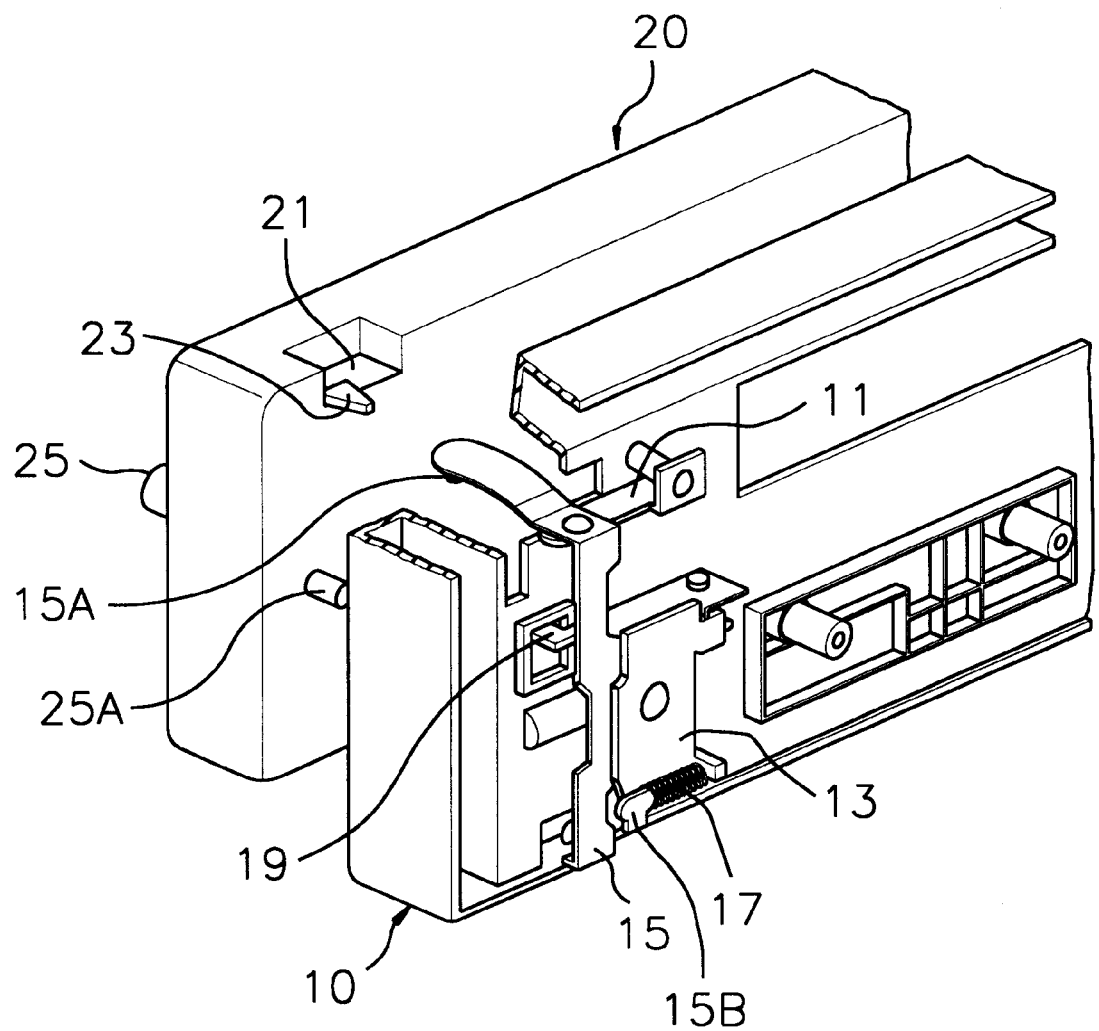
FIG. 1 is an exploded perspective view of a conventional panel detaching apparatus for a car-mounted audio system.
Figure 2A:
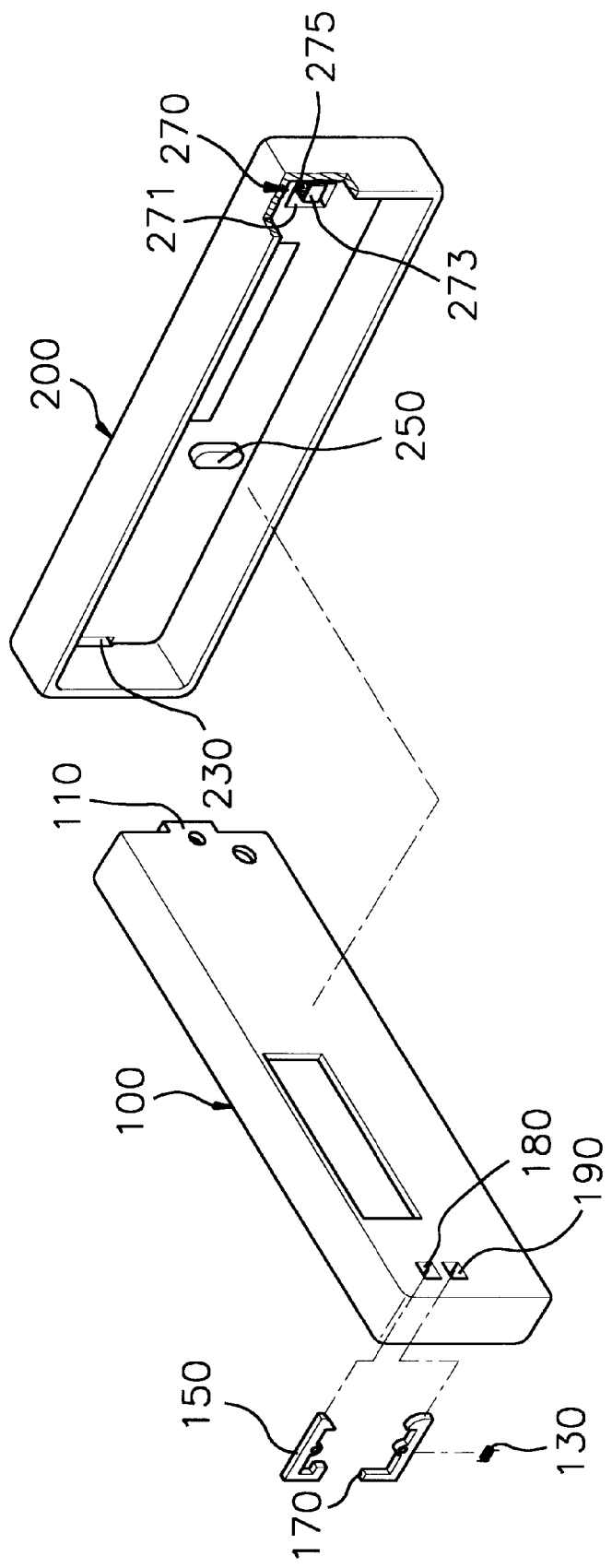
FIG. 2 is an exploded perspective view of a panel detaching apparatus for a car-mounted audio system according to the present invention.
Figure 2B:
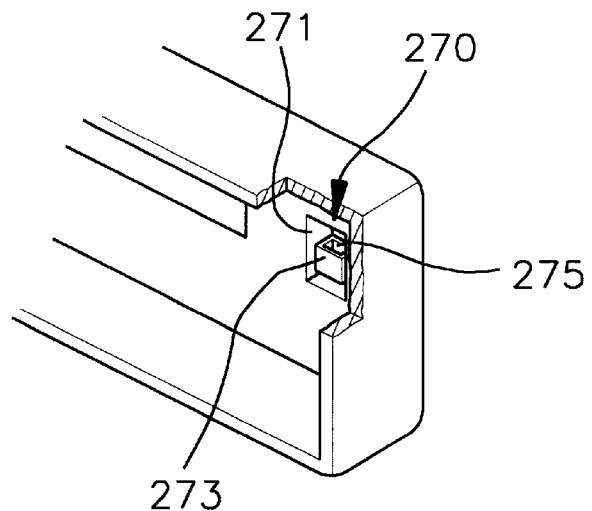
Figure 3:
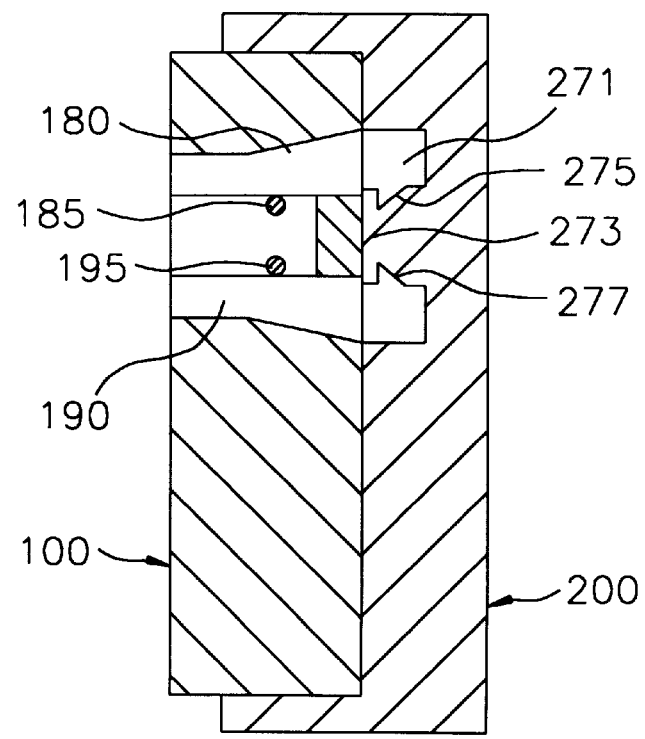
FIG. 3 is a sectional view for showing piercing holes and the connecting part of the panel detaching apparatus for the car-mounted audio system according to the present invention.
Figure 4:
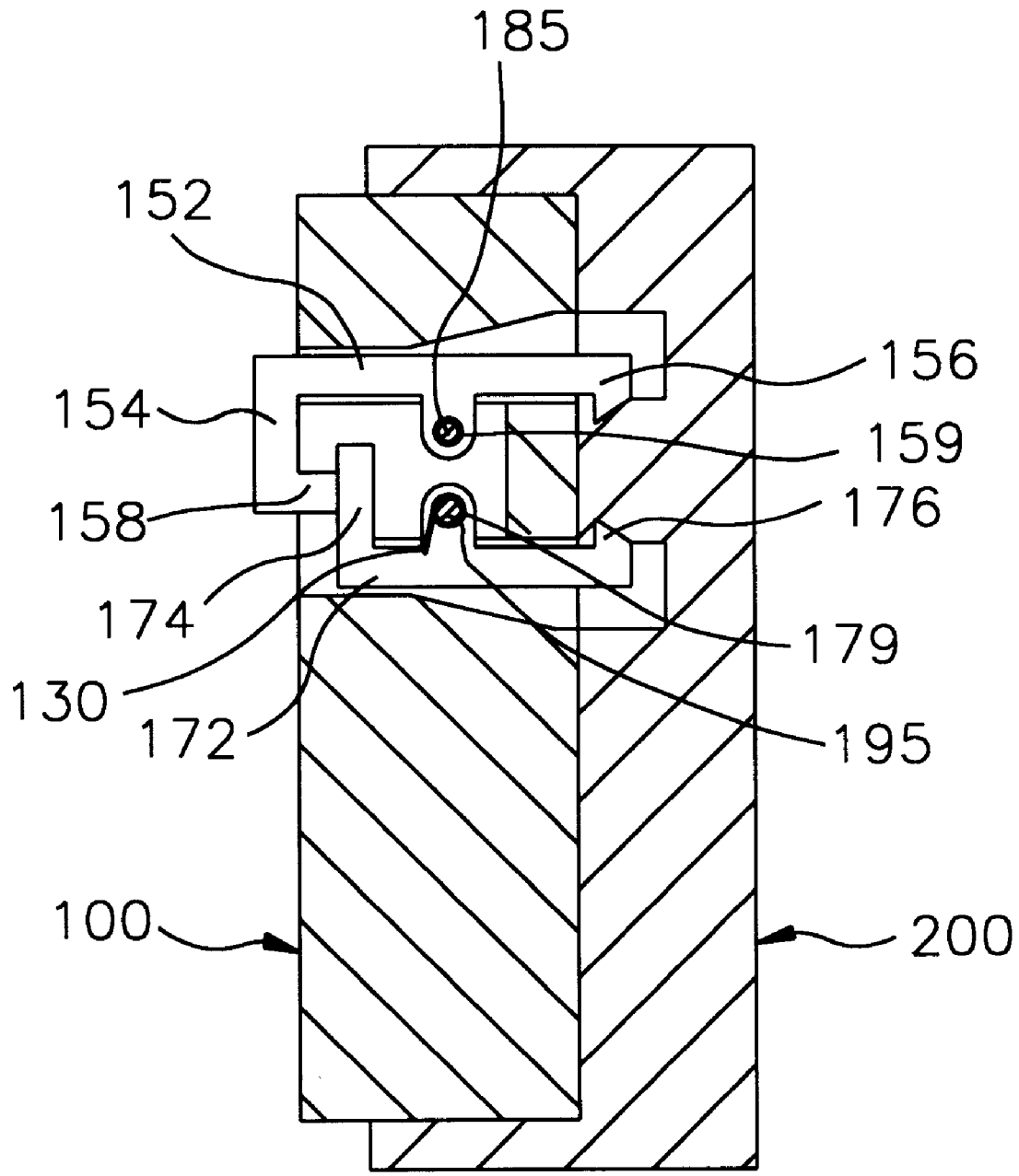
FIG. 4 is a sectional view of the panel detaching apparatus for the car-mounted audio system according to the present invention when the panel has been attached onto the escutcheon.
Figure 5:
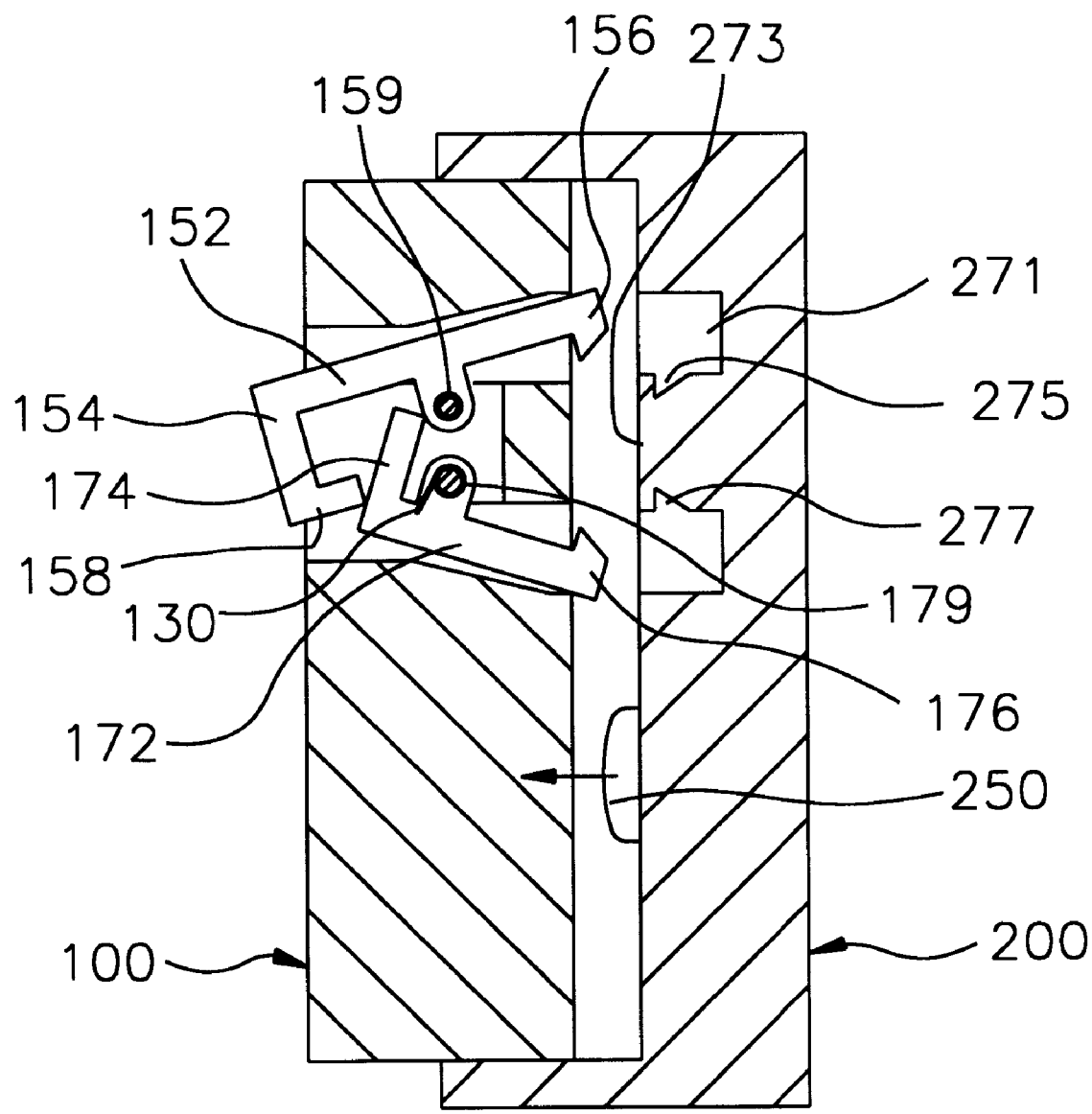
FIG. 5 is a sectional view of the panel detaching apparatus for the car-mounted audio system according to the present invention when the panel is detached from the escutcheon.

FIG. 2 is an exploded perspective view of a panel detaching apparatus for a car-mounted audio system according to the present invention. FIG. 3 is a sectional view for showing piercing holes and the connecting part of the panel detaching apparatus for the car-mounted audio system according to the present invention. FIG. 4 is a sectional view of the panel detaching apparatus for the car-mounted audio system according to the present invention when the panel has been attached onto the escutcheon. FIG. 5 is a sectional view of the panel detaching apparatus for the car-mounted audio system according to the present invention when the panel is detached from the escutcheon.

An escutcheon 200 for receiving a panel 100 is formed at the front side of a car-mounted audio system body. The panel 100 has a rotating shaft 110 protruding from an edge of the panel 100 and being bent toward the front side of the panel 100. Receiving part 230 which is cut open for receiving the rotating shaft 110 is formed at the escutcheon 200. An elastic part 250 elastically supported by a spring (unshown in figures) for taking the panel away from the escutcheon is mounted at the front face of the escutcheon 200.

The panel detaching apparatus for the car-mounted audio system has first and second fixing portions 150, 170 for attaching the panel 100 to the escutcheon 200 by the restoration force of a spring 130. First and second piercing holes 180, 190 for respectively receiving the first and second fixing portions 150, 170 are formed in the other side of the panel 100. First and second bosses 185, 195 for rotatably installing the first and second fixing portions 150, 170 at the panel 100 respectively protrude from each of the inner faces of the piercing holes 180, 190.

The first fixing portion 150 consists of a first lever 152, an ejecting knob 154, a pressing protrusion 156, and a first hook 158. A first connecting hole 159 for engaging with the first boss 185 is formed at the first lever 152. The ejecting knob 154 is downwardly bent from one side of the first lever 152 in parallel to the front face of the panel 100. The ejecting knob 154 is a button when the panel 100 has been detached from the escutcheon 200. The pressing protrusion 156 is bent from an end of the ejecting knob 154 in parallel to the first lever 152 toward the escutcheon 200. The second fixing portion 170 is operated depending on the pressing protrusion 156 according to the movement of the first fixing portion 150. The first hook 158 is bent from the other end of the first lever 152 in parallel to the ejecting knob 154. One end of the first hook 158 is a first sloping portion which makes an acute angle with the end of the ejecting knob 154.

The second fixing portion 170 consists of a second lever 172, a bending part 174, and a second hook 176. The second lever 172 has a second connecting hole 179 for engaging with the second boss 195. The bending part 174 is upwardly bent from one end of the second lever 172 in parallel to the front face of the panel 100. The second hook 176 is upwardly bent from the other end of the second lever 172 in parallel to the bending part 174. One end of the second hook 176 is a second sloping portion which makes an acute angle with the end of the bending part 174.

The first and second fixing portions 150, 170 are respectively engaged with the first and second bosses 185, 195 so that the bending part 174 may be pushed by the pressing protrusion 156 and may be rotated. The spring 130 is elastically supported to the second fixing portion 170. The second fixing portion 170 is operated according to the first fixing portion 150. The second fixing portion 170 is rotated in the opposite direction about the first fixing portion 150.

The first piercing hole 180 has a first inlet formed at the front face of the panel 100 and a first outlet formed at the rear face of the panel 100. In order to allow the first fixing portion 150 to rotate in the counter-clockwise direction when the panel 100 is detached from the escutcheon 200, the diameter of the first outlet is larger than the diameter of the first inlet. The second piercing hole 190 has a second inlet formed at the front face of the panel 100 and a second outlet formed at the rear face of the panel 200. In order to allow the second fixing portion 170 to rotate in the clockwise direction when the panel 100 is detached from the escutcheon 200, the diameter of the second outlet is larger than the diameter of the second inlet.

A connecting part 270 for engaging with the first and second fixing portions 150, 170 is formed at a position of the front face of the escutcheon 200 corresponding to the first and second fixing parts 150, 170.

The connecting part 270 has a depression part 271 sunk from the front face of the escutcheon 200. The depression part 271 receives the first and second fixing portions 150, 170 pushed out from the rear face of the panel 100 so that the panel is closely attached to the escutcheon 200. The depression part 271 has a fastener part 273 protruding from the depression part 271 and for fastening the first and second fixing portions 150, 170. First and second grooves 275, 277 for respectively engaging with the first and second fixing portions 150, 170 are respectively formed at positions of the connecting part 273 corresponding to the first and second fixing portions 150, 170.

Hereinafter, an operation of the panel detaching apparatus for the car-mounted audio system according the present invention will be described with reference to FIG. 2 through FIG. 5.

In order to attach the panel 100 onto the escutcheon 200, an operator inserts the rotating shaft 110 into the receiving part 230.

The operator rotates the panel 100 centering around the rotating shaft 110 toward the escutcheon 200 and pushes the panel 100 onto the escutcheon 200. The rear face of the panel 100 is pressed onto the elastic part 250.

When the first sloping portion has been moved along with one end of the fastener part 273, the first fixing portion 150 is rotated centering around the first boss 185 in the counter-clockwise direction. The pressing protrusion 156 pushes the bending part 174 over the elastic force of the spring 130. The second sloping portion moves along the other end of the fastener part 273. The second fixing portion 170 is rotated centering around the second boss 195 in the clockwise direction.

If the first and second sloping portions have been moved along the end of the fastening portion 273 from this end to the other end, the rear face of the panel 100 is closely attached to the front face of the escutcheon 200. The depression part 271 receives the first hook 158 and the second hook 176. The second fixing portion 170 is rotated by the restoration force of the spring 130 in the counter-clockwise direction. The bending part 174 pushes the pressing protrusion 156 toward the front face of the panel 100. The first fixing portion 150 is rotated in the clockwise direction. The first hook 158 is engaged with the first groove 275, and the second hook 176 is engaged with the second groove 277. Thus, the panel 100 is firmly attached to the escutcheon 200 by the restoration force of the spring 130.

Meanwhile, in order to detach the panel 100 from the escutcheon 200, the operator pushes the ejecting knob 154. The pressing protrusion 156 pushes the bending part 174 over the elastic force of the spring 130. The first fixing portion 150 is rotated centering around the first boss 185 in the counter-clockwise direction. The second fixing portion 170 is rotated centering around the second boss 195 in the clockwise direction. The first hook 158 is disengaged from the first groove 275, and the second hook 176 is disengaged from the second groove 277. The panel 100 is detached from the escutcheon 200 by the restoration force of the elastic part 250.

In the panel detaching apparatus for the car-mounted audio system according to the present invention, it is a first advantage that the panel can be easily attached onto the escutcheon simply with a few construction members.

Second advantage is low production cost and a short time to assemble a number of components with each other.

It is a third advantage that the operator just pushes the panel toward the escutcheon for mounting the front panel onto the escutcheon. That is, when the rotating shaft has been received in the receiving part, if the operator pushes the panel toward the escutcheon centering around the rotating shaft, the first and second fixing portions respectively fasten with the first and second grooves. The spring provides the restoration force to the second fixing portion, and then the panel is firmly attached to the escutcheon. Therefore, the panel detaching appratus for the car-mounted audio system prevents the panel from easily detaching from the esutcheon although the car body is joggled during the traveling time of the car.

It is understood that various other modifications will be apparent to and can be readily made by those skilled in the art without departing from the scope and spirit of this invention. Accordingly, it is not intended that the scope of the claims appended thereto be limited to the description as set forth herein, but rather that the claims be constructed as encompassing all the features of the patentable novelty that reside in the present invention, including all the features that would be treated as equivalents thereof by those skilled in the art to which this pertains.

What is claimed is:

1. A panel detaching apparatus for a car-mounted audio system comprising:

a panel having a side portion forming a rotating shaft therein and another side portion forming first and second piercing holes therein;

an escutcheon installed to a car audio body for receiving the panel, and the escutcheon having a receiving portion for contacting with the rotating shaft to rotate the panel centering around the rotating shaft;

an elastic part formed at a front face of the escutcheon toward the panel for elastically supporting the panel; and a panel detachable portion comprising:

first and second fixing parts respectively formed in the first and second piercing holes and for attaching the panel to the escutcheon by a restoration force of an elastic member;

first and second bosses respectively formed at inner faces formed by the first and second piercing holes and respectively contacted with the first and second fixing parts, so that the first and second fixing parts are respectively rotated centering around the first and second bosses; and a connecting part formed at the front face of the escutcheon corresponding to the first and second fixing parts and for engaging with the first and second fixing parts;

wherein the first fixing part comprises:

a first lever having a first connecting hole for engaging with the first boss;

an ejecting knob downwardly bent from one side of the first lever in parallel to the front face of the panel, and having a function as a button when the panel is detached from the escutcheon;

a pressing protrusion bent from an end of the ejecting knob in parallel to the first lever toward the escutcheon and for operating the second fixing portion according to the movement of the first fixing portion; and a first hook bent from the other end of the first lever in parallel to the ejecting knob;

whereby the first and second fixing parts are engaged with the connecting part by respectively rotating the first and second fixing Darts centering around the first and second bosses.

2. The panel detaching apparatus for the car-mounted audio system as claimed in claim 1, wherein the second fixing part is elastically supported by the elastic member, and the second fixing part is engaged with the connecting part by a restoration force of the elastic member when the panel is attached to the escutcheon.

3. The panel detaching apparatus for the car-mounted audio system as claimed in claim 1, wherein said second fixing part has:

a second lever having a second connecting hole for engaging with the second boss;

a bending part upwardly bent from one end of the second lever in parallel to the front face of the panel and for being pushed by the pressing protrusion; and a second hook upwardly bent from the other end of the second lever in parallel to the bending part.

4. The panel detaching apparatus for the car-mounted audio system as claimed in claim 1, wherein said second fixing part operates according to the first fixing part.

5. The panel detaching apparatus for the car-mounted audio system as claimed in claim 4, wherein said second fixing tart is rotated in the opposite direction about the first fixing part when the panel is detached from the escutcheon.

6. The panel detaching apparatus for the car-mounted audio system as claimed in claim 1, wherein said first piercing hole comprises:

a first inlet formed at the front face of the panel and a first outlet formed at the rear face of the panel;

wherein the diameter of the first outlet is larger than the diameter of the first inlet in order to allow the first fixing part to rotate in the counter-clockwise direction when the panel is detached from the escutcheon.

7. The panel detaching apparatus for the car-mounted audio system as claimed in claim 1, wherein said second piercing hole comprises:

a second inlet formed at the front face of the panel and a second outlet formed at the rear face of the panel;

wherein the diameter of the second outlet is larger than the diameter of the second inlet in order to allow the second fixing part to rotate in the clockwise direction when the panel is detached from the escutcheon.

8. The panel detaching apparatus for the car-mounted audio system as claimed in claim 1, wherein said connecting part comprises:

a depression part sunk from the front face of the escutcheon, and for receiving the first and second fixing parts pushed out from the rear face of the panel so that the panel is closely attached to the escutcheon; and a fastener part protruding from the depression part and for fastening the first and second fixing parts.

9. The panel detaching apparatus for the car-mounted audio system as claimed in claim 8, wherein said fastener part comprises first and second grooves respectively formed at the connecting part corresponding to the first and second fixing parts and for respectively engaging with the first and second fixing parts.

\* \* \* \* \*